(12) United States Patent
Su et al.

(10) Patent No.: US 6,774,008 B1
(45) Date of Patent: Aug. 10, 2004

(54) METHOD FOR FABRICATING SHALLOW TRENCH ISOLATION BETWEEN DEEP TRENCH CAPACITORS

(75) Inventors: Yi-Nan Su, Taipei Hsien (TW); Nathan Sun, Taipei Hsien (TW)

(73) Assignee: United Microeletronics Corp, Hsin-Chu (TW)

( * ) Notice: Subject to any disclaimer, the term of this patent is extended or adjusted under 35 U.S.C. 154(b) by 0 days.

(21) Appl. No.: 10/605,076

(22) Filed: Sep. 7, 2003

(51) Int. Cl.[7] .............................................. H01L 21/76
(52) U.S. Cl. .................................................... 438/424
(58) Field of Search ................................ 438/424, 381, 438/386, 388

(56) References Cited

U.S. PATENT DOCUMENTS 6,140,206 A * 10/2000 Li et al. ..................... 438/424

* cited by examiner

*Primary Examiner*—Craig A. Thompson
(74) *Attorney, Agent, or Firm*—Winston Hsu

(57) ABSTRACT

The present invention studs oxide dielectric into trench capacitor top recesses after the formation of the trench capacitor structures. A thin (500 Å) cap buffer nitride is then deposited over the substrate. The studded dielectric and the collar oxide protect the trench capacitors during the subsequent selective dry etching, thereby forming isolation trenches having an approximately T-shaped cross section between the trench capacitors within the memory array area of the semiconductor chip.

11 Claims, 11 Drawing Sheets

METHOD FOR FABRICATING SHALLOW TRENCH ISOLATION BETWEEN DEEP TRENCH CAPACITORS

BACKGROUND OF INVENTION

1. Field of the Invention

The present invention relates to a method for fabricating shallow trench isolation (STI) between deep trench capacitors and, more particularly, a logic-process compatible method for fabricating shallow trench isolation (STI) between deep trench capacitors of trench-capacitor dynamic random access memory (DRAM) devices.

2. Description of the Prior Art

Trench-capacitor DRAMdevices are known in the art. Typically, a trench-storage capacitor consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor. After forming the trench capacitors, shallow trench isolation (STI) regions are formed on the substrate between the trench capacitors.

Generally, the prior art STI process for trench capacitor DRAM devices includes the following main steps:
1. Deep trench (DT) process;
2. Cap hard mask layer deposition and patterning;
3. Hard mask etching and photoresist strip;
4. STI trench etching and hard mask strip; and
5. STI gap fill and planarization.

Referring to FIG. 1 to FIG. 5 of schematic cross-sectional views showing the fabrication of STI regions between trench capacitors according to the prior art method. As shown in FIG. 1, a semiconductor chip 1 comprising a logic area 11 and a memory array area 12 is provided. As indicated, a plurality of trench capacitors 20 have been formed in the semiconductor substrate 10 within the memory array area 12 of the semiconductor chip 1. Typically, each of the trench capacitors 20 comprises a buried plate diffusion (not shown) acting as one electrode of the capacitor, a poly storage node 24 serving as the other electrode of the capacitor, and a node dielectric 22 between the two electrodes. A collar oxide layer 26 is formed on an upper portion of the deep trenches. A pad nitride layer 14 laid over the semiconductor substrate 10 is typically used to define the openings of the deep trenches. At this stage, after forming the trench capacitor structures 20, there is a recess 28 left on each top of the trench capacitor structures 20.

As shown in FIG. 2, a doped silicate glass layer 32 is deposited on the surface of the semiconductor chip 1. The doped silicate glass layer 32 has a thickness of about 3000 to 4000 angstroms. Typically, the doped silicate glass layer 32 is made of borosilicate glass (BSG) or borophosposilicate glass (BPSG). The doped silicate glass layer 32 covers the pad nitride 14 and fills the recesses 28.

As shown in FIG. 3, a bottom anti-reflection coating (BARC) 34 is deposited on the doped silicate glass layer 32, followed by photoresist coating. A conventional lithographic process and subsequent baking process are then carried out to pattern the photoresist coating, thereby forming a photo mask 36 defining memory array area trench openings 43 and logic area trench openings 45 therein.

As shown in FIG. 4, using the photo mask 36 as an etching mask, a plasma dry etching is performed to etch the BARC 34, the doped silicate glass layer 32, the pad nitride 14, the silicon substrate 10, a portion of the storage node 24, and a portion of the collar oxide 26 through the memory array area trench openings 43 within the memory array area 12, thereby forming isolation trenches 53, and to etch the BARC 34, the doped silicate glass layer 32, the pad nitride 14, the silicon substrate 10 through the logic area trench openings 45 within the logic area 11, thereby forming isolation trenches 55. Thereafter, the remaining photo mask 36, the BARC 34, and the doped silicate glass layer 32 are removed. Finally, as shown in FIG. 5, the isolation trenches 53 and 55 are filled with gap fill dielectric 58 and planarized.

However, there are several problems with the above-described prior art STI method for trench capacitor DRAM devices. First, the thick hard mask (doped silicate glass layer 32) leads to bad critical dimension (CD) uniformity and large iso/dense CD bias. Secondly, the STI trench recipe is difficult to develop because of the complex structure of the trench capacitor. Thirdly, the above-described prior art STI method for trench capacitor DRAM devices is not compatible with the logic processes.

SUMMARY OF INVENTION

Accordingly, the primary object of the present invention is to provide an improved STI method for trench capacitor DRAM devices to form STI between trench capacitors and such method is compatible with the logic processes.

According to one preferred embodiment of this invention, a method for fabricating shallow trench isolation (STI) between deep trench capacitors is disclosed. A semiconductor substrate having thereon a patterned pad layer is provided. The semiconductor substrate has a plurality of deep trench capacitors formed therein, each of which comprising a buried plate in the semiconductor substrate serving as one electrode of the deep trench capacitor, a storage node serving as the other electrode of the deep trench capacitor, a node dielectric layer between the buried plate and the storage node, and a collar oxide disposed at an upper portion of the deep trench capacitor. A dielectric layer is filled into a capacitor top recess on each of the deep trench capacitors. The studded dielectric layer has a top surface that is coplanar with the pad layer. A buffer layer is deposited over the semiconductor substrate. A photo mask defining trench openings is formed over the buffer layer. A plasma etching process is performed to etch the buffer layer, the pad layer, and then etching into the semiconductor substrate selective to the dielectric layer and the collar oxide that both keep the deep trench capacitors intact through the trench openings, thereby forming isolation trenches between the deep trench capacitors. After stripping the photo mask, the isolation trenches are filled with gap filling material.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
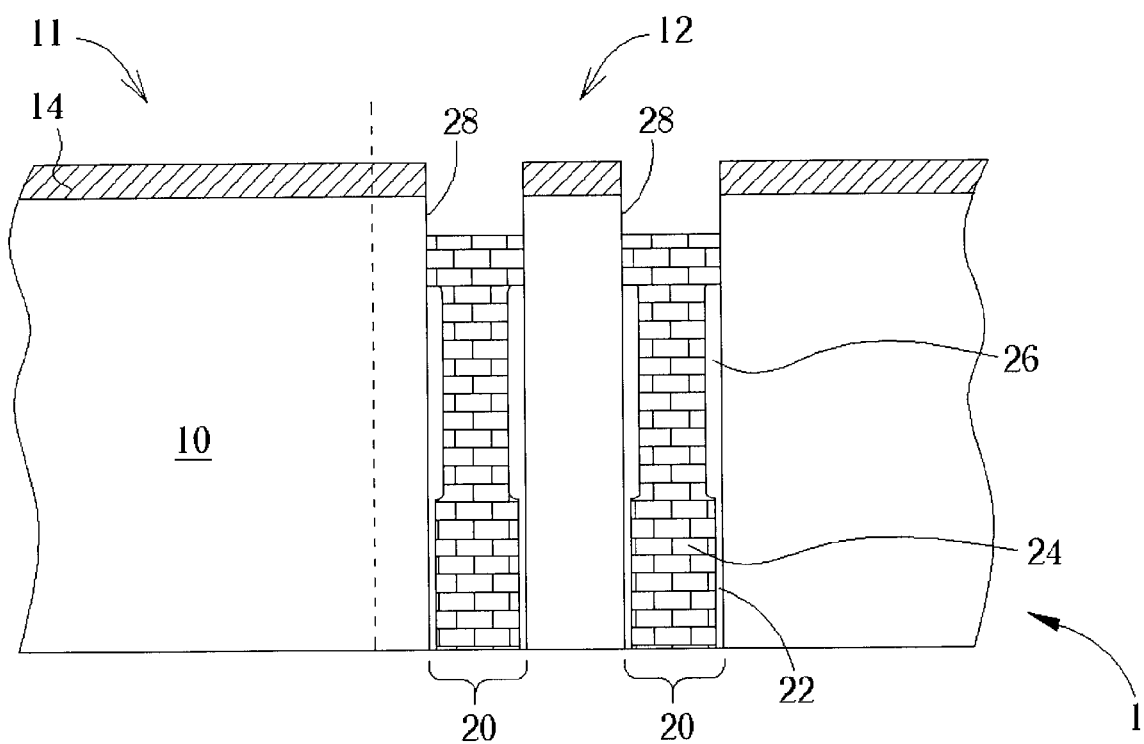
FIG. 1 to FIG. 5 are schematic cross-sectional views showing the fabrication of STI regions between trench capacitors according to the prior art method.
Figure 2:
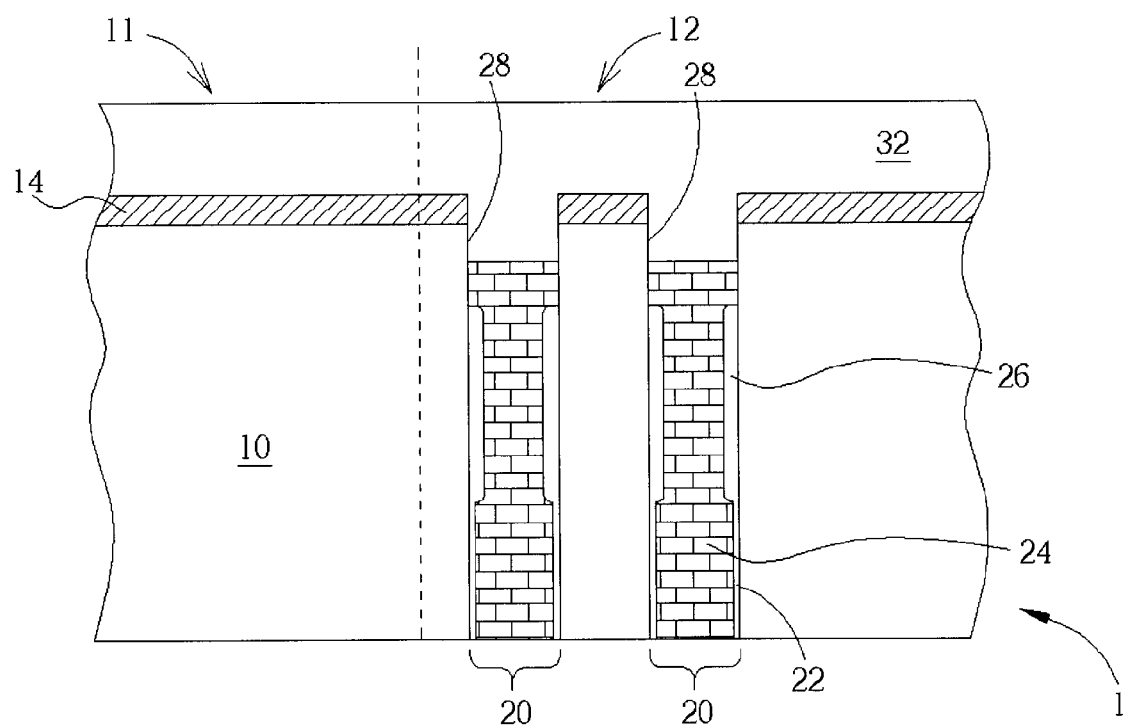
Figure 3:
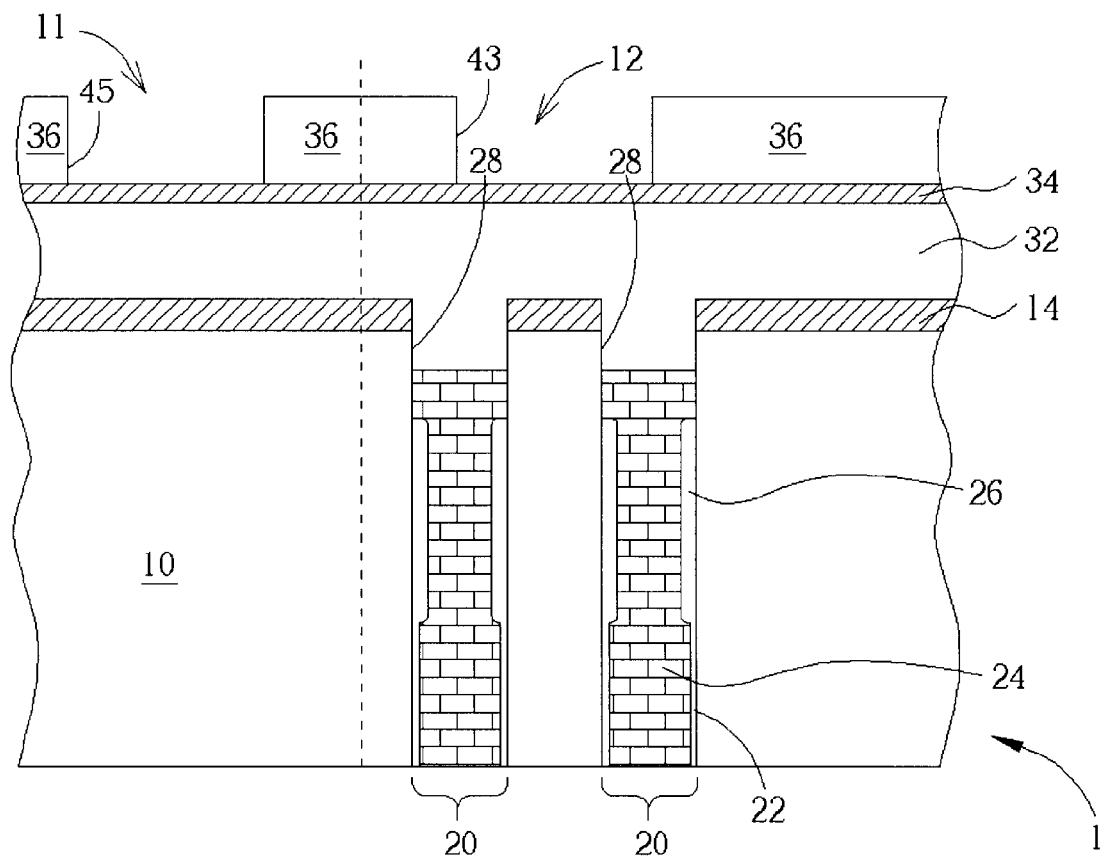
Figure 4:
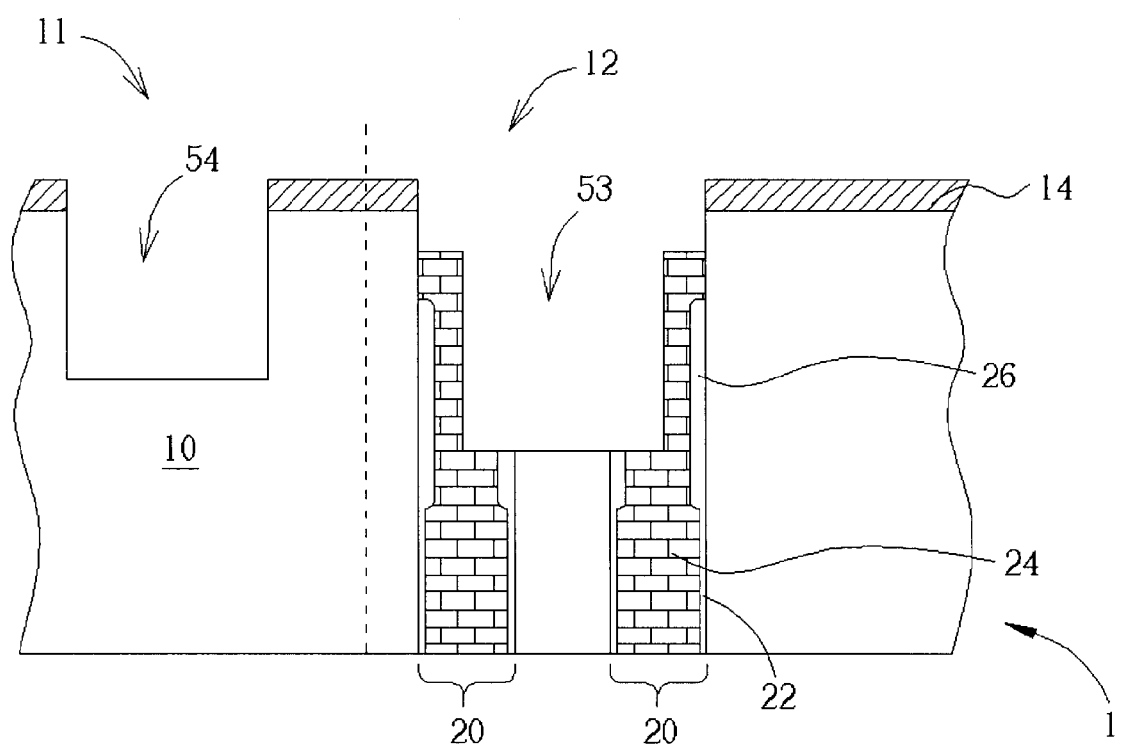
Figure 5:
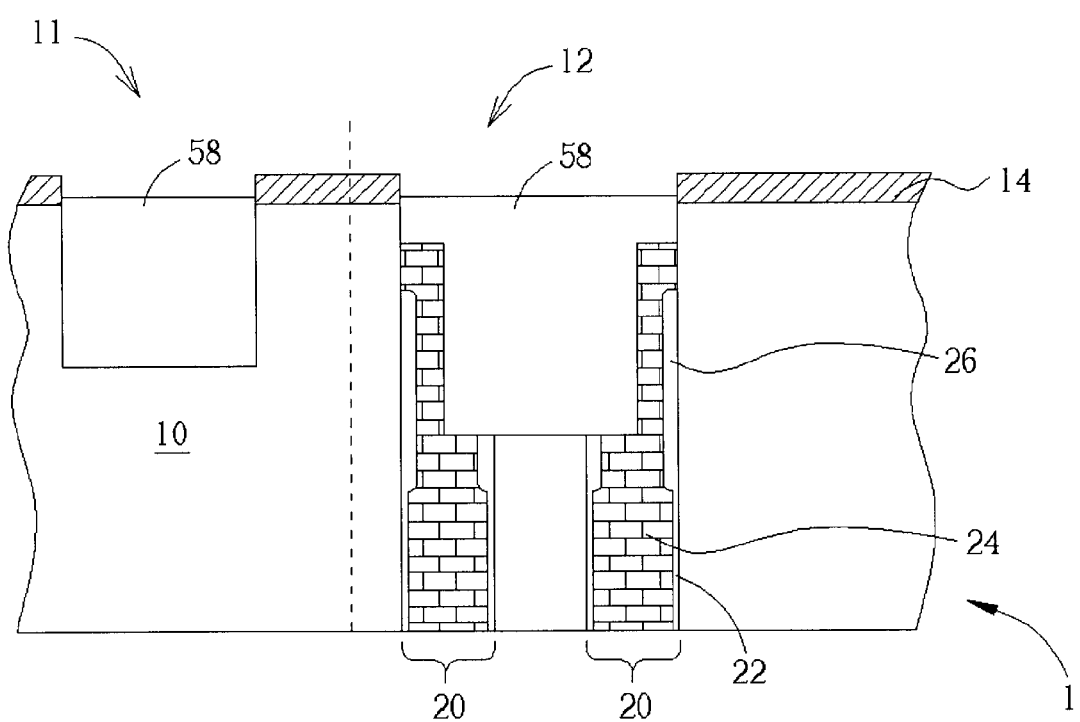
Figure 6:
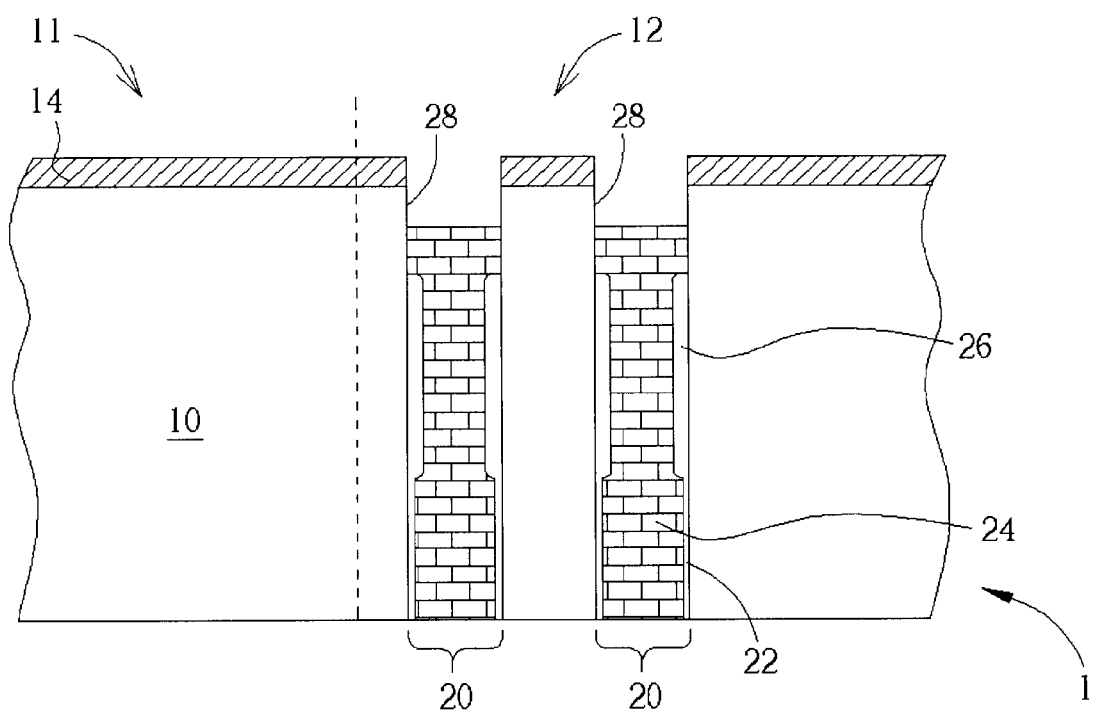
FIG. 6 to FIG. 11 are schematic cross-sectional views showing the fabrication of STI regions between trench capacitors according to one preferred embodiment of the present invention.

Referring to FIG. 6 to FIG. 11 of schematic cross-sectional views showing the fabrication of STI regions between trench capacitors according to one preferred embodiment of the present invention, in which like reference numerals designate similar or corresponding elements, regions, and portions. As shown in FIG. 6, a semiconductor chip 1 comprising a logic area 11 and a memory array area 12 is provided. As indicated, a plurality of trench capacitors 20 have been formed in the silicon substrate 10 within the memory array area 12 of the semiconductor chip 1. Each of the trench capacitors 20 comprises a buried plate diffusion (not shown) serving as one electrode of the capacitor, a poly storage node 24 serving as the other electrode of the capacitor, and a node dielectric 22 between the two electrodes. A collar oxide layer 26 is formed on an upper portion of the deep trenches. A pad nitride layer 14 laid over the semiconductor substrate 10 is used to define the openings of the deep trenches. At this stage, after forming the trench capacitor structures 20, there is a recess 28 (capacitor top recess) left on each top of the trench capacitor structures 20.

Figure 7:
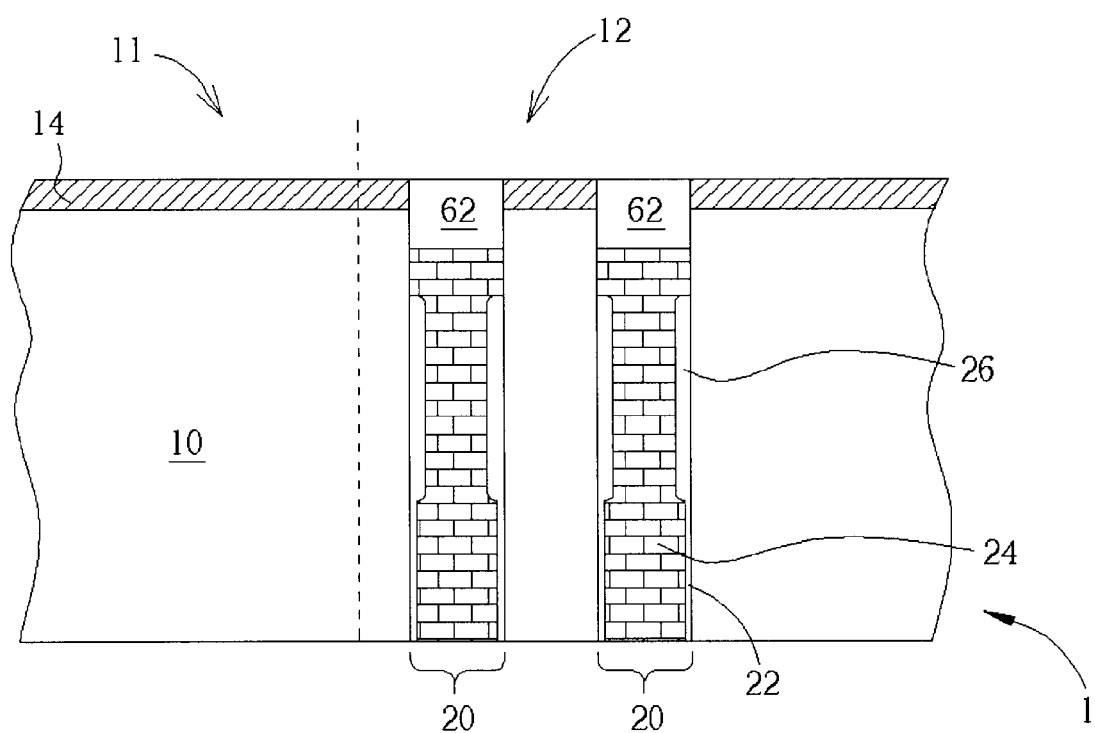

As shown in FIG. 7, dielectric layer (not shown) is deposited over the semiconductor chip 1. The dielectric layer, preferably an HDPCVD oxide layer formed by conventional high-density plasma chemical vapor deposition (HDPCVD) methods, is then polished by CMP stopping on the pad nitride 14, thereby leaving the remaining dielectric layer 62 studded in the recesses 28 on the trench capacitors 20. The remaining dielectric layer 62 studded in the recesses 28 has a top surface that is substantially coplanar with the surrounding pad nitride 14. At this phase, the semiconductor chip 1 has a planar topography.

Figure 8:
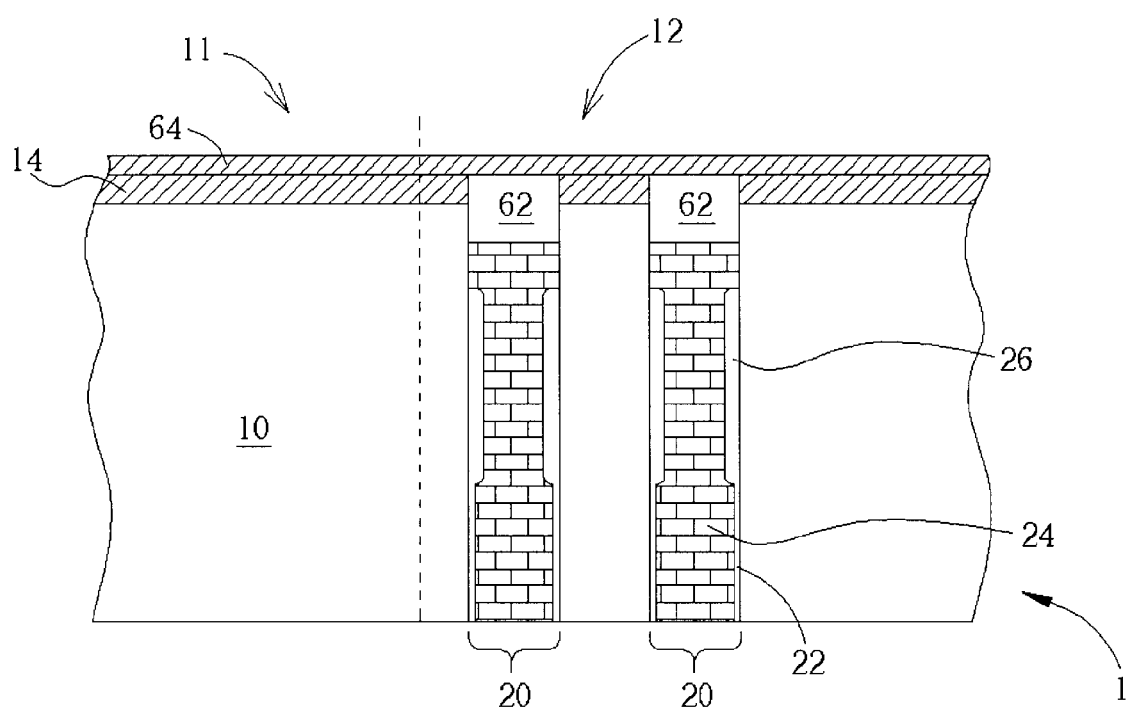

As shown in FIG. 8, a buffer layer 64 is then deposited over the semiconductor chip 1. The buffer layer 64, which covers the studded dielectric layer 62 and the pad nitride 14, has a relatively thinner thickness of about 500 angstroms comparing with the prior art method. According to the preferred embodiment of this invention, the buffer layer is made of silicon nitride or silicon oxynitride (SiON), preferably silicon nitride, but not limited thereto.

Figure 9:
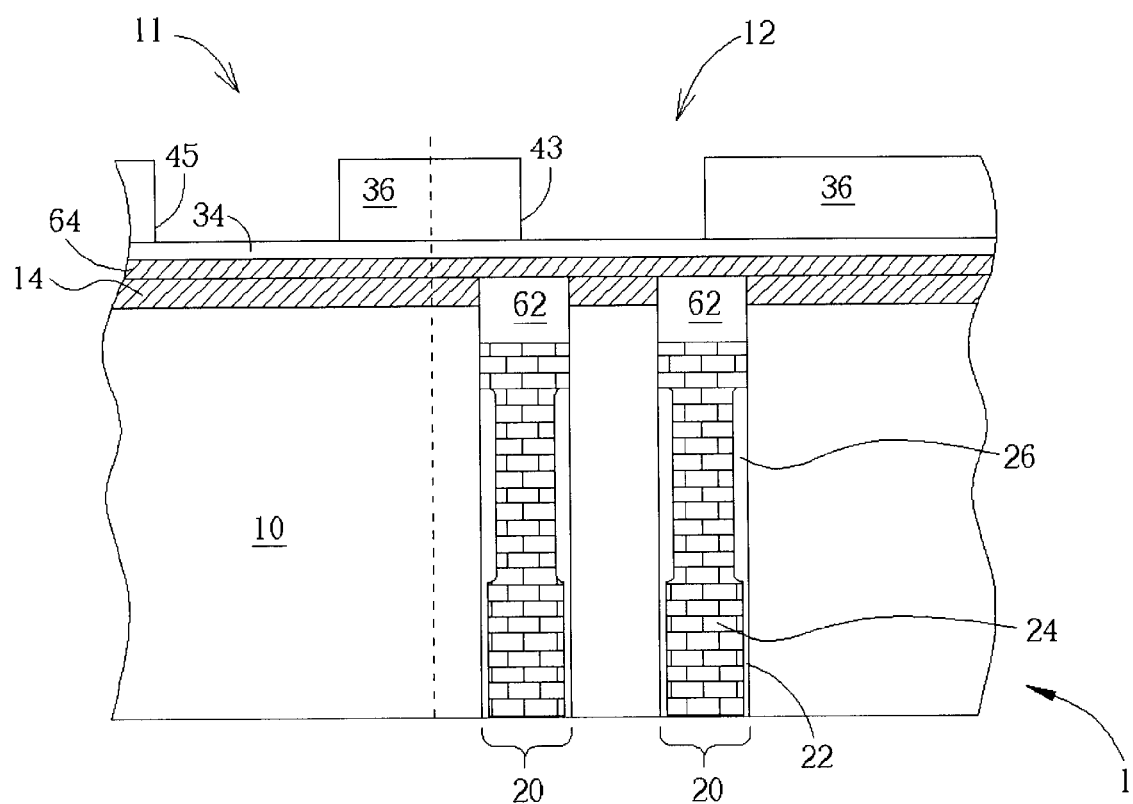

As shown in FIG. 9, a bottom anti-reflection coating (BARC) 34 is deposited on the buffer layer 64, followed by photoresist coating. A conventional lithographic process and subsequent baking process are then carried out to pattern the photoresist coating, thereby forming a photo mask 36 defining memory array area trench openings 43 and logic area trench openings 45 therein. It is noted that, in another embodiment, the BARC 34 may be omitted.

Figure 10:
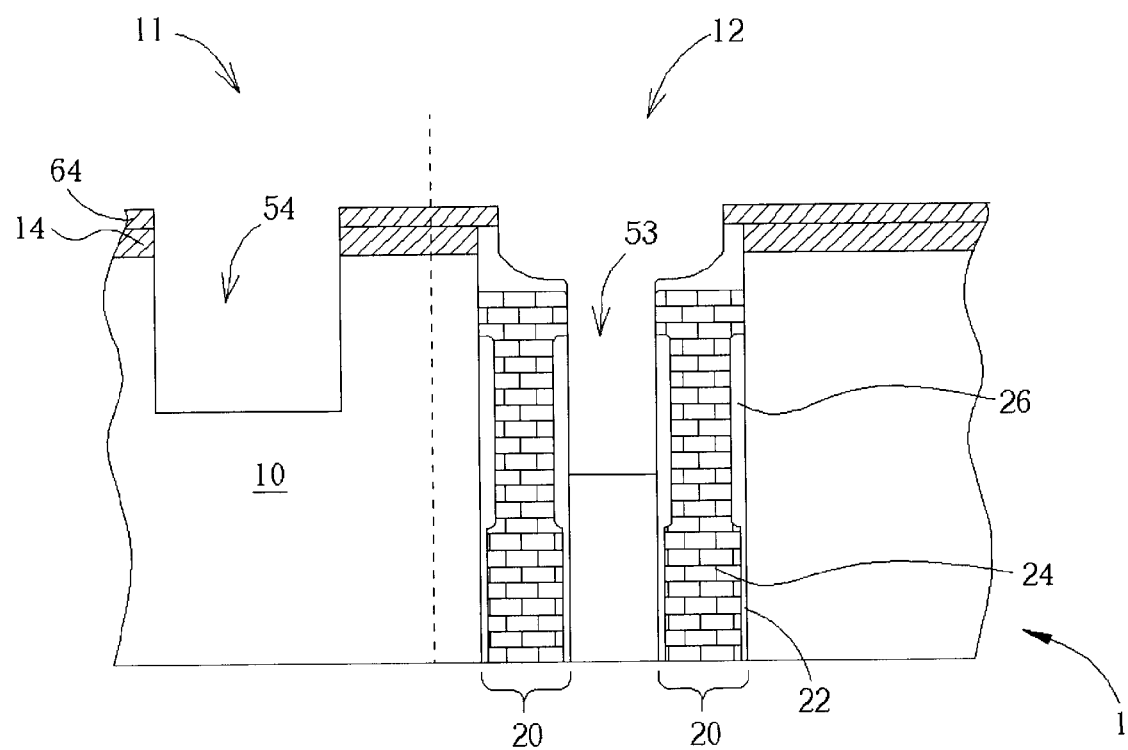

As shown in FIGS. 9 and 10, using the photo mask 36, the studded dielectric layer 62, and the collar oxide 26 as an etching mask, a plasma dry etching is performed to etch the BARC 34, the nitride buffer layer 32, the pad nitride 14, and the silicon substrate 10 through the memory array area trench openings 43 and the logic area trench openings 45 selective to the oxide dielectric layer 62 and the collar oxide 26, thereby forming isolation trenches 53 and 55, respectively. As indicated, the resultant isolation trenches 53 within the memory array area 12 have an approximately T-shaped cross section. This is because the plasma dry etching uses a plasma recipe selective to the oxide dielectric layer 62 and the collar oxide 26 that protect the trench capacitors 20 during the etching. Thereafter, the photo mask 36 and the BARC 34 are removed.

Figure 11:
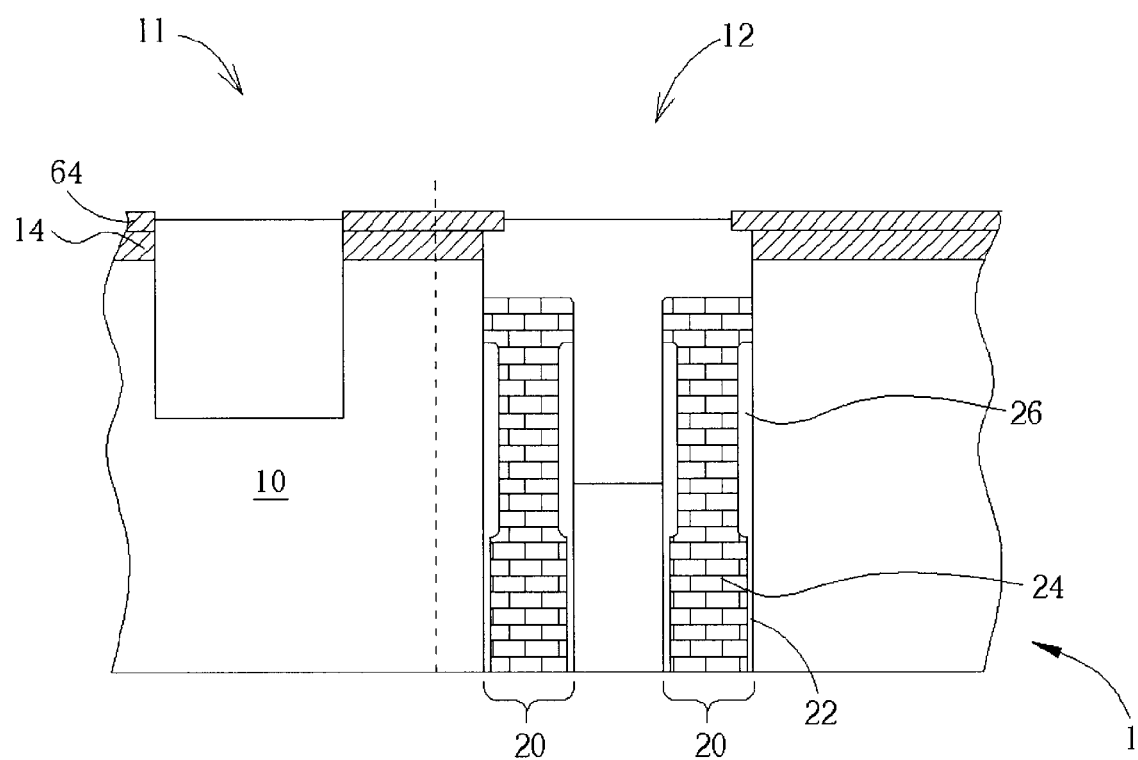

Finally, as shown in FIG. 11, the isolation trenches 53 and 55 are filled with gap fill dielectric 58 and planarized.

To sum up, the present invention studs oxide dielectric 62 into trench capacitor top recesses 28 after the formation of the trench capacitor structures 20. A cap buffer nitride 64 is then deposited over the substrate 10. The studded oxide dielectric 62 and the collar oxide 26 protect the trench capacitor during the subsequent selective dry etching, thereby forming isolation trenches having an approximately T-shaped cross section within the memory array area of the semiconductor chip 1. The present invention avoids the use of thick doped-silicate glass hard mask 32, thereby controlling the CD uniformity. Further, the recipe of STI trench etching is easy to control since the etching is selective to oxide dielectric 62 and the collar oxide 26, and the etching of complex capacitor structure 20 is avoided. Moreover, the present invention method is compatible with the logic processes.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for fabricating shallow trench isolation (STI) between deep trench capacitors, comprising the steps of:

providing a semiconductor substrate having thereon a pad layer, wherein the semiconductor substrate has a logic area and a memory array area and a plurality of deep trench capacitors are formed within the memory array area, and wherein each of the deep trench capacitors comprises a buried plate in the semiconductor substrate serving as one electrode of the deep trench capacitor, a storage node serving as the other electrode of the deep trench capacitor, a node dielectric layer between the buried plate and the storage node, and a collar oxide disposed at an upper portion of the deep trench capacitor;

studding a dielectric layer into a capacitor top recess on each of the deep trench capacitors, and the studded dielectric layer having a top surface that is coplanar with the pad layer;

depositing a buffer layer over the semiconductor substrate;

depositing a bottom anti-reflection coating (BARC) over the buffer layer;

forming a photo mask defining memory array trench openings and logic area trench openings over the BARC;

through the memory array trench openings and logic area trench openings, dry etching the BARC, the buffer layer, the pad layer, and then etching into the semiconductor substrate selective to the dielectric layer and the collar oxide that both keep the deep trench capacitors intact, thereby forming isolation trenches between the deep trench capacitors within the memory array area and isolation trenches within the logic area;

stripping the photo mask and the BARC; and filling the isolation trenches within the memory array area and the logic area with gap filling material.

2. The method of claim 1 wherein the method of studding a dielectric layer into a capacitor top recess on each of the deep trench capacitors comprises depositing an HDPCVD oxide over the semiconductor substrate, and then chemical mechanical polishing the HDPCVD oxide stopping on the pad layer.

3. The method of claim 1 wherein the pad layer is composed of silicon nitride.

4. The method of claim 1 wherein the buffer layer is composed of silicon nitride.

5. The method of claim 1 wherein the buffer layer has a thickness of about 500 angstroms.

6. A method for fabricating shallow trench isolation (STI) between deep trench capacitors, comprising the steps of:

provided a semiconductor substrate having thereon a pad layer, wherein the semiconductor substrate has a plurality of deep trench capacitors formed therein, each of which comprising a buried plate in the semiconductor substrate serving as one electrode of the deep trench capacitor, a storage node serving as the other electrode of the deep trench capacitor, a node dielectric layer between the buried plate and the storage node, and a collar oxide disposed at an upper portion of the deep trench capacitor;

studding a dielectric layer into a capacitor top recess on each of the deep trench capacitors, and the studded dielectric layer having a top surface that is coplanar with the pad layer;

depositing a buffer layer over the semiconductor substrate;

forming a photo mask defining trench openings over the buffer layer;

through the trench openings, dry etching the buffer layer, the pad layer, and then etching into the semiconductor substrate selective to the dielectric layer and the collar oxide that both keep the deep trench capacitors intact, thereby forming isolation trenches between the deep trench capacitors;

stripping the photo mask; and filling the isolation trenches with gap filling material.

7. The method of claim 6 wherein a bottom anti-reflection coating (BARC) is formed on the buffer layer.

8. The method of claim 6 wherein the method of studding a dielectric layer into a capacitor top recess on each of the deep trench capacitors comprises depositing an HDPCVD oxide over the semiconductor substrate, and then chemical mechanical polishing the HDPCVD oxide stopping on the pad layer.

9. The method of claim 6 wherein the pad layer is composed of silicon nitride.

10. The method of claim 6 wherein the buffer layer is composed of silicon nitride.

11. The method of claim 10 wherein the buffer layer has a thickness of about 500 angstroms.

* * * * *